(12) United States Patent
Hirayanagi

(10) Patent No.: US 6,522,519 B1
(45) Date of Patent: Feb. 18, 2003

(54) ELECTROSTATIC CHUCKING DEVICE AND METHODS FOR HOLDING MICROLITHOGRAPHIC SAMPLE

(75) Inventor: Noriyuki Hirayanagi, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/560,830

(22) Filed: Apr. 28, 2000

(30) Foreign Application Priority Data

May 7, 1999 (JP) .......................................... 11-126660

(51) Int. Cl.[7] .............................................. H01G 23/00
(52) U.S. Cl. ...................................... 361/234; 361/233
(58) Field of Search ................................. 361/234, 233

(56) References Cited

U.S. PATENT DOCUMENTS 6,108,189 A * 10/2000 Weldon et al. ............... 361/234

OTHER PUBLICATIONS

Kubota, Yoshihiro, "Seiden Chakku to Sono Ouyou (The Electrostatic Chuck and its Application)," *Denshi Zairyou (Electronics Materials)*, Jul. 1996, p. 51.
Balakrishnan et al., "Johnsen–Rahbek Effect with an Electronic Semi–Conductor," *British J. Appl. Phys.* 1:211–213 (1950).
Field, John, "Electrostatic Wafer Clamping for Next–Generation Manufacturing," *Solid State Technol.*, pp. 91–98, Sep. 1994.
Watanabe et al., "Relationship between Electrical Resistivity and Electrostatic Force of Alumina Electrostatic Chuck," *Jpn. J. Appl. Phys.* 32:864–871 (1993).

* cited by examiner

*Primary Examiner*—Stephen W. Jackson
(74) *Attorney, Agent, or Firm*—Klarquist Sparkman LLP

(57) ABSTRACT

The subject electrostatic chucking devices hold a semiconductor wafer or analogous sample for microlithography or the like and prevent decreases in accuracy and precision of microlithographic pattern transfer that would otherwise arise due to current leakage to the wafer and to wafer displacement from thermal expansion. The chucking device includes an insulative substrate, multiple electrodes on the substrate, and multiple dielectric layers applied over the electrodes such that the electrodes are sandwiched between the insulator substrate and the dielectric layers. The dielectric layers are disposed so as to define a planar chucking surface divided into multiple regions. For example, a first region is made of a ceramic having a relatively low volume resistivity so as to attract the wafer mainly by a Johnsen-Rahbek force. A second dielectric-layer region is made of a ceramic having a relatively high volume resistivity so as to attract the wafer mainly by a Coulomb force.

37 Claims, 3 Drawing Sheets

ELECTROSTATIC CHUCKING DEVICE AND METHODS FOR HOLDING MICROLITHOGRAPHIC SAMPLE

FIELD OF THE INVENTION

The present invention pertains to improved electrostatic chucking devices used to secure a sample such as a semiconductor wafer in a microlithography apparatus. More specifically, the invention is directed to such devices that prevent decreases in microlithographic exposure accuracy and precision due to leakage of current from the chucking device to the wafer, thereby reducing wafer heating and consequent thermal distortion of the wafer.

BACKGROUND OF THE INVENTION

A conventional electrostatic chucking device 51 is depicted schematically in FIG. 2. The device 51 is constructed of electrically insulative materials with interior electrically conductive electrodes 67, 69. The electrodes 67, 69 are electrically connected to a controlled power source 79 that supplies a voltage to each of the electrodes 67, 69. More specifically, the device 51 comprises a substrate 71 (normally made of a ceramic material) and a dielectric layer 61. The electrodes 67, 69 are situated between the substrate 71 and dielectric layer 61. The dielectric layer 61 includes a sample-contacting surface 60 parallel to the electrodes 67, 69.

The dielectric layer 61 typically has a thickness of a few hundred micrometers. Whenever a sample 3 (e.g., silicon wafer) is placed on the sample-contacting surface 60 and voltage is applied to the electrodes 67, 69, an electrostatic force, either a Coulomb force or a Johnsen-Rahbek force, is generated between the device 51 and the wafer 3. The force causes the wafer 3 to be electrostatically attracted to and thus held fast by the device 51.

Generally speaking, the Coulomb force dominates whenever the dielectric layer 61 has a large volume resistivity (e.g., greater than $10^{14}$ Ω-cm for $Al_2O_3$), and the Johnsen-Rahbek force dominates whenever the dielectric layer 61 has a small volume resistivity (e.g., within a range of $10^{10}$ to $10^{12}$ Ω-cm for $Al_2O_3$).

A Coulomb chucking force is a function of and substantially affected by the dielectric constant of the dielectric layer 61. Hence, to obtain a large Coulomb chucking force, the dielectric constant of the dielectric layer 61 should be correspondingly large. A Johnsen-Rahbek chucking force, in contrast, is a function of and substantially affected by the width of any gaps (microscopic or otherwise) between the sample-contacting surface 60 and the wafer 3. Hence, to obtain a large Johnsen-Rahbek chucking force, the sample-contacting surface 60 normally has a particular surface roughness.

Any of various problems can occur whenever a conventional electrostatic chucking device 51 is used to hold a sample (e.g., semiconductor wafer) in an electron-beam or other charged-particle-beam (CPB) microlithography (projection-exposure) apparatus. As noted above, if the volume resistivity of the dielectric layer 61 is relatively small, then the Johnsen-Rahbek force dominates and a strong chucking force can be obtained. However, whenever the volume resistivity of the dielectric layer 61 is relatively small, a voltage applied between the electrodes 67, 69 and the wafer 3 causes electrical current to flow to the wafer (e.g., 500 μA current to 300-mm diameter wafer). The magnetic field generated from such a current can have a deleterious effect on a charged particle beam used for projection-exposure of a pattern to the wafer, which can result in a decreased accuracy of the exposed pattern.

On the other hand, as noted above, if the volume resistivity of the dielectric layer 61 is relatively high, then the Coulomb force dominates. Whenever the volume resistivity of the dielectric layer 61 is relatively high, very little current flows to the wafer 3. However, the ceramic material normally used to make the dielectric layer 61 generally has a relatively small dielectric constant, so a strong chucking force cannot be obtained. As a result, there is a substantial risk of the wafer 3 being displaced on or from the chucking device during microlithographic exposure. A principal cause of such detachment is thermal deformation of the wafer 3 caused by CPB-mediated heating of the wafer.

SUMMARY OF THE INVENTION

In view of the shortcomings of the prior art summarized above, an object of the invention is to provide electrostatic chucking devices, especially for use in microlithography, that exhibit improved resistance to decreases in exposure accuracy and precision due to current leakage to the sample (wafer) and/or displacement of the sample from thermal expansion.

To such end, and according to a first aspect of the invention, electrostatic chucking devices are provided to which a sample can be secured by an electrostatic chucking force. A representative embodiment comprises a chucking surface that comprises a dielectric layer. The dielectric layer is divided into at least a first region and a second region each formed of a respective dielectric material having a different respective dielectric property. The chucking device also comprises a respective electrode associated with each region. The first region desirably has a volume resistivity of $10^{14}$ Ω-cm or higher, and the second region desirably has a volume resistivity of $10^{13}$ Ω-cm or less. In addition, the first region desirably occupies at least 20% of the surface area of the chucking surface, and the second region desirably occupies no more than 30% of the surface area.

Alternatively, the first region can have a dielectric constant of 20 or higher, and the second region can have a dielectric constant of less than 20.

Each of the first and second regions of the dielectric layer can have multiple portions. The portions of both regions can be, for example, arranged concentrically with each other in ring-shaped configurations. Alternatively, for example, the second regions can be arranged as multiple point loci dispersed in the first region(s).

According to another embodiment, an electrostatic chucking device comprises an electrically insulative substrate, an electrostatic electrode situated on an upstream-facing surface of the insulative substrate, and a dielectric layer defining a sample-contacting surface. The dielectric layer is situated on the electrostatic electrode such that the electrostatic electrode is sandwiched between the insulative substrate and the dielectric layer. The dielectric layer comprises at least two coplanar portions at the chucking surface, wherein each planar portion is formed of a respective dielectric material having a different dielectric property than the other dielectric material.

In one configuration of this embodiment, the first region has a volume resistivity of $10^{14}$ Ω-cm or higher, and the second region has a volume resistivity of $10^{13}$ Ω-cm or less. In this configuration, the first region desirably occupies at least 20% of the surface area, and the second region desirably occupies no more than 30% of the surface area.

Alternatively, the first region can have a dielectric constant of 20 or higher, and the second region can have a dielectric constant of less than 20.

Further desirably, each electrode is configured so as to be energized with a voltage that can be independently controllable for each electrode. For example, the electrodes can be connected to a power source configured to energize the electrodes such that the sample held by the chucking device has a ground electrical potential.

The chucking surface can be roughed so as to have at least one indentation that is no more than 20 μm deep relative to the chucking surface.

According to another aspect of the invention, methods are provided for holding a microlithographic sample. In a representative embodiment of such a method, an electrostatic chuck is provided that comprises a dielectric layer divided into at least a first and a second region each formed of a respective dielectric material having a different respective dielectric property. A respective electrode is provided for each region. The electrodes are independently energized with respective voltages sufficient to hold the sample on the chucking surface. The configurations and properties of the dielectric layer can be as summarized above.

The foregoing and additional features and advantages of the invention will be more readily apparent from the following detailed description, which proceeds with reference to the accompanying drawings.

BRIEF DESCRIPTION OF THE DRAWINGS

FIGS. 1(A)–1(B) schematically depict an electrostatic chucking device according to a first representative embodiment of the invention, wherein FIG. 1(A) is a plan view, and FIG. 1(B) is an elevational sectional view along the line A—A' in FIG. 1(A).

DETAILED DESCRIPTION

General Considerations

Figure 1A:
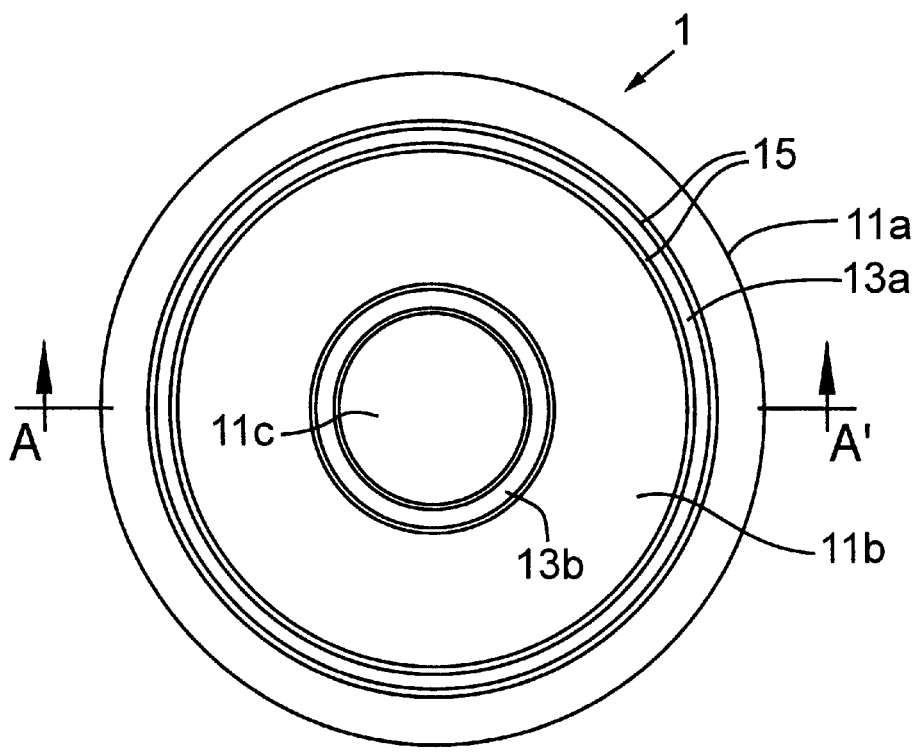

An electrostatic chucking device according to the present invention generally comprises a chucking surface (desirably a planar surface for holding a wafer) that utilizes an electrostatic chucking force to hold a sample mounted to the chucking device. The chucking surface is formed of a dielectric layer divided into at least two regions each made of a respective dielectric material. The dielectric materials have at least one dielectric property that is different from one material to the other.

More specifically, the chucking device comprises an electrically insulative substrate having an upstream-facing surface. An electrostatic electrode is disposed on the upstream-facing surface of the insulative substrate, and a dielectric layer defining a planar sample-contacting surface is disposed such that the electrode is sandwiched between the substrate and the dielectric layer. The dielectric layer is divided into at least two regions each defining a respective portion of the planar sample-contacting surface. Each region is made of a respective dielectric material. The dielectric materials have at least one dielectric property that is different from one material to the other.

Regarding the dielectric materials, one property that can be different (independently of other properties) is the volume resistivity. For example, at least one of the regions of the chucking surface can be made of a dielectric material having a "low" volume resistivity of $10^{13}$ Ω-cm or less (e.g., $10^9$–$10^{12}$ Ω-cm) which is useful for generating a Johnsen-Rahbek force sufficient for holding a silicon wafer to the chucking surface. In such an instance, at least one other region of the chucking surface is made of a dielectric material having a "high" volume resistivity of $10^{14}$ or higher (e.g., $10^{14}$–$10^{17}$ Ω-cm) which is useful for generating a Coulomb force sufficient for holding a silicon wafer to the chucking surface.

By providing at least one Coulomb-force-generating region and at least one Johnsen-Rahbek-force-generating region on the chucking surface, the sample can be held to the chucking surface with a strong chucking force while minimizing overall electrical current flowing to the sample. Consequently, the sample is highly resistant to being displaced relative to the chucking surface while being held on the chucking surface.

In an especially desirable configuration, the region(s) having a high volume resistivity (i.e., the region(s) that generate the Coulomb force) occupy at least 20% of the area of the chucking surface, and the region(s) having a low volume resistivity (i.e., the region(s) that generate the Johnsen-Rahbek force) occupy no more than 30% of the area of the chucking surface. Desirably, each region that generates the Johnsen-Rahbek force occupies a relatively small proportion of the area of the chucking surface and multiple such regions are dispersed over the chucking surface. The region(s) that generate the Coulomb force desirably are located outside the region(s) that generate the Johnsen-Rahbek force. The region(s) that generate the Coulomb force are especially useful for reducing or preventing sample (e.g., wafer) warping and maintaining flatness of the sample. On the other hand, the region(s) that generate the Johnsen-Rahbek force produce a strong chucking force that holds the sample whenever the Coulomb force is insufficient or whenever the Coulomb force must be limited to control thermal distortion of the sample. Consequently, the sample can be held strongly to the chucking surface with minimal thermal displacement.

In a more specific embodiment, the region(s) that generate the Johnsen-Rahbek force can be configured as multiple concentric rings on the chucking surface, wherein each ring has a relatively "narrow" radial width (i.e., a radial width less than the radial width of any of the regions in which the Coulomb force is intended to predominate). Alternatively, the regions that generate the Johnsen-Rahbek force can be configured as multiple islands dispersed throughout all or a portion of the region(s) that generate the Coulomb force. The total area of the islands desirably is less than the Coulomb-force area in which the islands are dispersed.

Further with respect to the dielectric materials, another property that can be different (independently of other properties) is dielectric constant. For example, at least one of the regions of the chucking surface can be made of a dielectric material having a dielectric constant of 20 or higher. In such an instance, at least one other region can be made of a dielectric material having a dielectric constant of less than 20. Such a configuration generates a strong chucking force only in regions of the chucking surface where a strong chucking force is necessary. (The larger the dielectric constant, the greater the chucking force.) In this manner, it is possible to control locations subjected to the Johnsen-Rahbek force.

Associated with each region (including individual islands, if present) of the chucking surface is a respective electrode independently connected to a controlled power source. Desirably, the voltage applied to the respective electrodes is independently controlled. Such a configuration allows superior control of the balance, relative to the prior art, of the current leakage to the sample held on the chucking surface versus the chucking force. Also, with this configuration, the sample can be held at a ground potential without adversely affecting the chucking force. Holding the sample at a ground potential imparts less adverse affect to a charged particle beam impinging on the sample held on the chucking surface.

The chucking surface can be "roughed" to reduce the contact area of the chucking surface with the surface of the sample contacting the chucking surface. During "roughing," the chucking surface is provided with one or more indentations below the plane of the chucking surface. Thus, by reducing the contact area, possible adverse effects of particles situated between the sample and the chucking surface are minimized. Desirably, the indentations extend depthwise at least about 0.5 $\mu$m, but no more than about 20 $\mu$m, from the plane of the chucking surface. This depth range is suitable for minimizing adverse effects of the size range of particles usually encountered in modern microlithography processes. Also, by limiting the depth in this manner, an electrostatic chucking force is maintained in the non-contact regions, which contributes significantly to the overall force with which the sample is held to the chucking surface.

Representative Embodiment 1

Figure 1B:
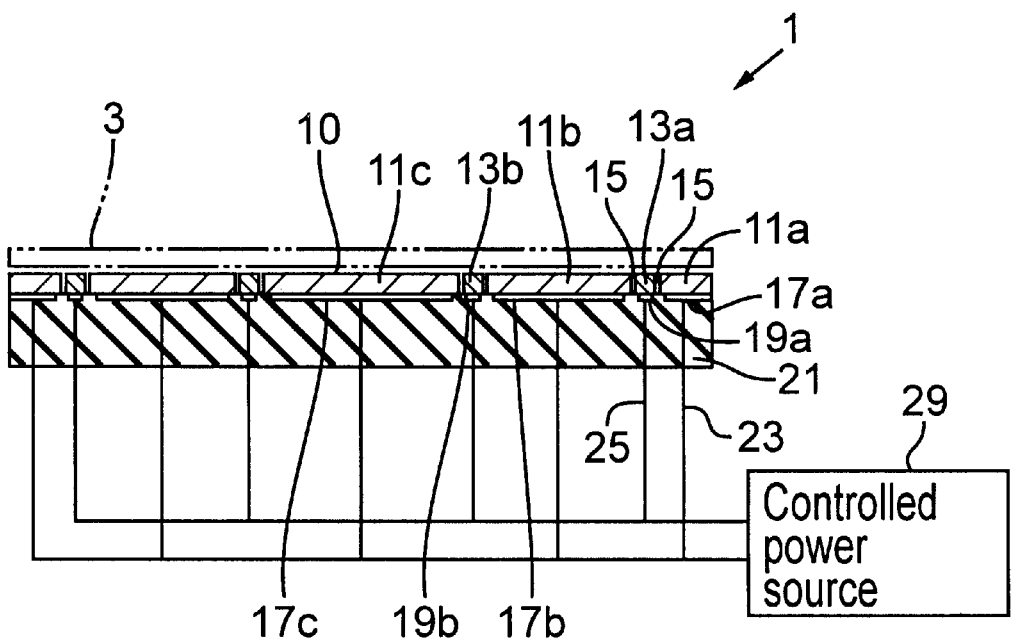
Figure 2:
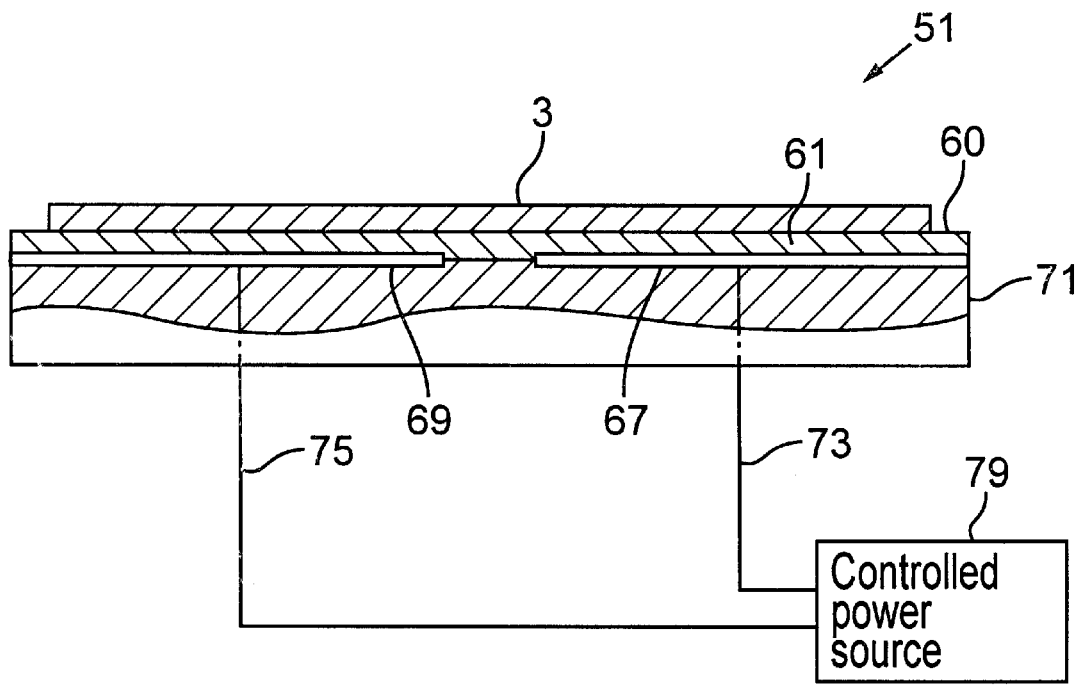
FIG. 2 is a schematic elevational sectional view of a conventional electrostatic chucking device.

FIGS. 1(A)–1(B) schematically depict a representative embodiment of an electrostatic chucking device 1 according to the invention. The chucking device 1 has a three-layer configuration comprising an insulative substrate 21 of ceramic or other suitable material, electrodes 17a–17c and 19a–19b situated on an upstream-facing surface of the substrate 21, and regions 11a–11c and 13a–13b of first and second dielectric materials, respectively, placed over the electrodes. The upstream-facing surfaces of the dielectric materials collectively constitute a planar chucking surface 10. In this embodiment, the chucking surface 10 is divided into five regions corresponding to the regions 11a–11c and 13a–13b arranged as shown. The chucking surface 10 has a plan profile (FIG. 1(A)) that desirably is round to correspond to the typically round profile of a wafer. The dielectric-layer regions 11a, 11b, 11c, 13a, 13b are disposed in concentric circles (rings) on the chucking surface 10. (These regions need not be circular, but circular is desired because of the inherent symmetry in circles, especially in view of the fact that nearly all wafers are circular or nearly so.) The center region 11c desirably is round. The adjacent region 13b is situated radially outside the center region 11c and desirably has a relatively narrow ring profile. (By "relatively narrow" is meant that the radial width of the ring 13b is narrower than the respective radial width of any of the regions 11a, 11b, 11c.) The next adjacent region 11b is situated radially outside the region 13b and desirably has a relatively broad ring-shaped profile (i.e., having a radial width greater than any of the regions 13a, 13b). The next adjacent region 13a is situated radially outside the region 11b and desirably has a narrow-ring profile. The radial width of the region 13b need not be identical to the radial width of the region 13a. The outermost, or peripheral, region 11a has a ring-shaped profile desirably having a wider radial width than the region 13a.

Each of the dielectric-layer regions 13a, 13b consists of a ceramic material having a relatively low volume resistivity (desirably $10^{13}$ $\Omega$-cm or less). An exemplary material is alumina. (Any of various other ceramics could also be used, especially those with lower coefficients of thermal expansion.) In this regard, it is noted that the volume resistivity of a particular ceramic can be changed simply by altering the method for manufacturing the material or by altering the chemical composition of the material. Due to their low volume resistivity, the regions 13a and 13b attract the wafer 3 mainly by a Johnsen-Rahbek force. Each of the regions 13a, 13b, has a relatively small area compared to any of the regions 11, 11b, 11c so as to limit the area(s) from which the Johnsen-Rahbek force is applied.

Each of the dielectric-layer regions 11a, 11b, 11c consists of a ceramic material having a high volume resistivity (desirably $10^{14}$ $\Omega$-cm or higher). An exemplary material is alumina, but any of various other ceramics could be used. To obtain a more uniform chucking force, all three regions 11a, 11b, 11c desirably are made from the same material with the same volume resistivity. The dielectric-layer regions 11a, 11b, 11c attract the wafer 3 mainly by a Coulomb force. (For $Al_2O_3$, the Coulomb force is predominant at a volume resistivity of $10^{14}$ $\Omega$-cm or greater, and the Johnsen-Rahbek force is predominant at a volume resistivity of $10^{10}$–$10^{12}$ $\Omega$-cm. These ranges can differ depending upon the materials involved.)

The dielectric-layer regions 11a–11c and 13a–13b are secured to the insulator substrate 21 desirably by an adhesive such as epoxy resin. Sandwiched between each dielectric-layer region and the substrate 21 is a respective electrode. Thus, the respective positions of each region 11a–11c, 13a–13b are stabilized relative to one another. Because the materials of the dielectric layer generally have different coefficients of thermal expansion, a small gap 15 (desirably several hundred micrometers) desirably is provided between each dielectric-layer region.

As shown in FIG. 1(B), a respective electrode 17a, 17b, 17c, 19a, 19b is situated beneath each dielectric-layer region 11a, 11b, 11c, 13a, 13b, respectively. The planar aspect of each electrode 17a–17c, 19a–19b essentially corresponds to the planar aspect of the corresponding dielectric-layer region 11a–11c, 13a–13b, respectively.

Each electrode 17a, 17b, 17c, 19a, 19b is electrically connected (desirably separately connected) to a controlled power source 29. Because, in this embodiment, a separate electrode 17a, 17b, 17c, 19a, 19b is associated each dielectric-layer region 11a, 11b, 11c, 13a, 13b, respectively, the voltage supplied to each electrode can be controlled independently. Such a configuration allows different voltages to be applied to the Coulomb-force regions 11a, 11b, 11c and to the Johnsen-Rahbek-force regions 13a, 13b. For example, the voltage applied to each of the Coulomb-force regions 11a, 11b, 11c can be 600 V to 1.5 KV dc. (The applied voltage is determined by the desired force to be generated and the dielectric constant(s) of the materials involved.) Also by way of example, the voltage applied to each of the Johnsen-Rahbek-force regions 13a, 13b can be 400 to 600 V dc. Even if different voltages are applied in this manner, little to no adverse effects are manifest on a wafer 3 (at ground potential) held by the chucking device 1. Such a wafer also experiences little to no adverse effects on an electron beam (or other charged particle beam) incident at the wafer surface.

In this embodiment as described above, the electrodes 17a–17c, 19a–19b are arranged and energized individually. Alternatively, the electrodes can be arranged in a bipolar manner, in a unipolar manner (in which the wafer is grounded and the electrodes are positively charged), or in any of various other connection relationships allowing subdivision of certain electrodes and/or other electrode-control schemes as required or desired.

Due especially to the limitation of area producing the Johnson-Rahbeck force, an electrostatic chucking device as described above results in substantially reduced current flow to the wafer and a markedly reduced probability of wafer displacement on the chucking device.

Furthermore, the two types of ceramic-material regions 11a–11c and 13a–13b, respectively, do not have to be configured as concentric rings. The Johnsen-Rahbek-force regions 13a–13b alternatively can be configured as individual islands situated within a Coulomb-force region 11a–11c.

Representative Embodiment 2

Figure 3:
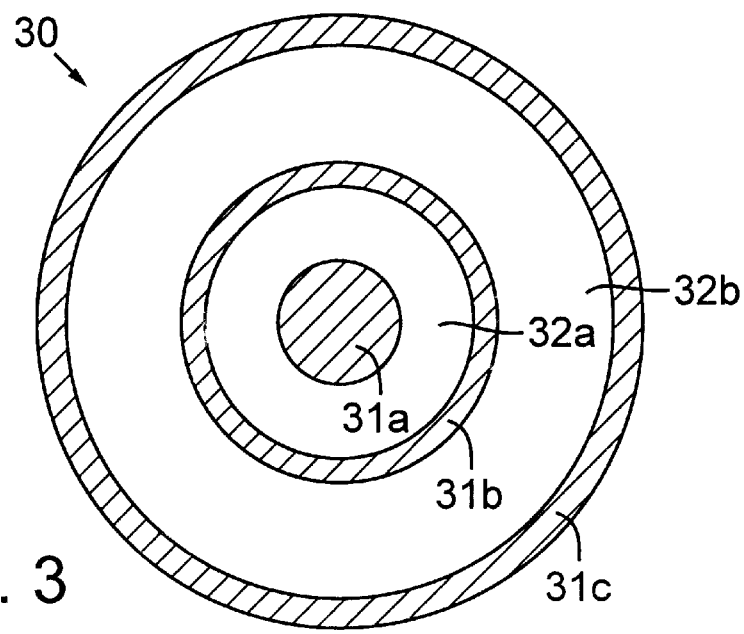
FIG. 3 schematic plan view of an electrostatic chucking device according to a second representative embodiment.

Referring to FIG. 3, an electrostatic chuck 30 according to this embodiment has a surface divided into regions each having a different surface roughness. Regions 31a, 31b, 31c have a first surface roughness and regions 32a, 32b have a second surface roughness. Each surface can have a surface micro-profile of the "pin bed" type to control particulates.

Figure 4:
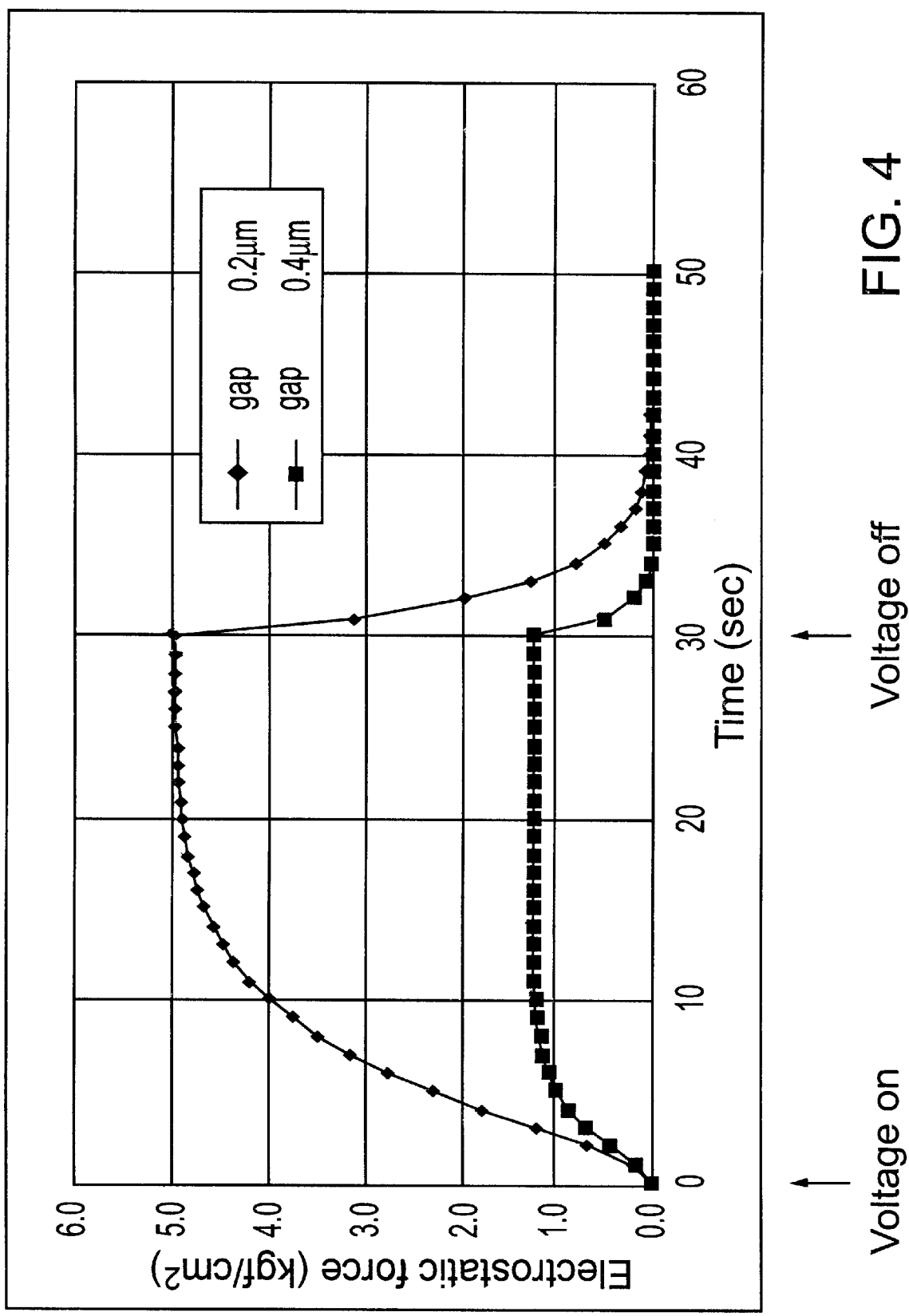
FIG. 4 is a plot of electrostatic force versus time for each of two surface-roughness values, in connection with the second representative embodiment.

A representative relationship between the electrostatic force and the gap between the wafer and the chuck surface, and the time variation of the electrostatic force is shown in FIG. 4. To obtain the data shown in FIG. 4, gaps of 0.2 μm and 0.4 μm were considered. The abscissa is time (seconds), and the ordinate is electrostatic force (Kgf/cm$^2$). At time=0 sec, an electric potential is applied to the electrode, and at time=30 sec, the potential is turned off. From FIG. 4, it can be understood readily that, with a gap of 0.2 μm, the maximal obtainable force is much larger than with a gap of 0.4 μm, but force rise-times and fall-times are longer.

The gap between the wafer and the chuck surface is determined by the surface roughness of both. To obtain a gap of 0.2 μm for the regions 31a, 31b, 31c, the surface roughness of the chuck surface should be less than 0.2 μm (Ra).

The main purpose of the regions 31a–31c is to reduce deformation of the wafer due to thermal expansion caused by electron-beam irradiation. Desirably, the regions 31a–31c are configured and arranged concentrically. The ratio of the areas of the regions 31a–31c relative to the areas 32a–32b can be determined, taking into consideration the mechanical wafer-detachment force when the wafer is to be de-chucked. For example, using the chuck shown in FIG. 4, when the wafer is changed 5 sec after power off, the force in the regions 32a–32b is almost zero, whereas the force in the regions 31a–31c is 500 gf/cm$^2$. Assuming a wafer area of 300 cm$^2$, an area ratio of the nail bed profile of 10 percent, and a wafer-lift force of 5 Kgf, the area ratio of the regions 31a–31c is less than about 13 percent.

A chuck as shown in FIG. 3 is simple to fabricate. First, the entire surface (ceramic) of the chuck is polished by conventional technique to the highest smoothness required. Then, selected regions are ground to provide them with greater roughness.

EXAMPLE

A specific example of an electrostatic chucking device according to the invention is as follows. It will be understood, however, that this example is not to be construed as limiting in any way.

Insulative substrate material: alumina, thickness: 10 mm

Electrodes: titanium, thickness: 0.01 mm

Voltage applied to electrodes at dielectric having low volume resistivity: 400 V dc Voltage applied to electrodes at dielectric having high volume resistivity: 1000 V dc Low volume resistivity dielectric: alumina with thickness of 0.2 mm and radial width of 10 mm (each of two concentric rings); outer diameter (of inner ring): 30 mm, outer diameter (of outer ring): 70 mm; percentage of area of chucking surface: 16%; volume resistivity: $5 \times 10^{10}$ Ω-cm; dielectric constant: 10.

High volume resistivity dielectric: alumina with thickness of 0.2 mm; percentage of area of chucking surface: 84%; volume resistivity: $5 \times 10^{15}$ Ω-cm; dielectric constant: 10

In a representative method for making an electrostatic chucking device according to the invention, the insulative substrate and overlying dielectric materials are separately prepared. Each electrode is formed on a downstream-facing surface of the respective ring of dielectric material. The rings of dielectric material and the insulative substrate are bonded together concentrically using a suitable adhesive such as an epoxy adhesive. Finally, each electrode is connected to respective terminals allowing connection of the electrodes to the controlled power source 29.

Hence, the present invention provides an electrostatic chucking device that facilitates increased microlithographic exposure accuracy by reducing current leakage to the sample (wafer or the like), as well as reduced thermal-expansion displacement of the sample.

Whereas the invention has been described in connection with a representative embodiment and example, it will be understood that the invention is not limited to those embodiments. On the contrary, the invention is intended to encompass all modifications, alternatives, and equivalents as may be included within the spirit and scope of the invention as defined by the appended claims.

What is claimed is:

1. An electrostatic chucking device to which a sample can be secured by an electrostatic chucking force, comprising:
    a chucking surface comprising a dielectric layer, the dielectric layer being divided into at least a first and a second region each formed of a respective dielectric material having a different respective dielectric property; and
    a respective electrode associated with each region.

2. The electrostatic chucking device of claim 1, wherein the first region has a volume resistivity of $10^{14}$ Ω-cm or higher, and the second region has a volume resistivity of $10^{13}$ Ω-cm or less.

3. The electrostatic chucking device of claim 2, wherein:
    the chucking surface has a surface area;
    the first region occupies at least 20% of the surface area; and
    the second region occupies no more than 30% of the surface area.

4. The electrostatic chucking device of claim 3, wherein the first region comprises a center portion of the chucking surface and at least a first ring-shaped portion concentric with the center portion but separated from the center portion on the chucking surface by a first ring-shaped portion of the second region.

5. The electrostatic chucking device of claim 4, wherein:
    the first region further comprises a second ring-shaped portion;
    the second region further comprises a second ring-shaped portion; and
    the second ring-shaped portion of the second region is separated from the first ring-shaped portion of the second region by the second ring-shaped portion of the first region.

6. The electrostatic chucking device of claim 1, wherein the first region has a dielectric constant of 20 or higher, and the second region has a dielectric constant of less than 20.

7. The electrostatic chucking device of claim 1, wherein each electrode is configured so as to be energized with a voltage that can be independently controllable for each electrode.

8. The electrostatic chucking device of claim 1, further comprising a power source to which the electrodes are electrically connected, the power source being configured to energize the electrodes such that the sample held by the chucking device has a ground electrical potential.

9. The electrostatic chucking device of claim 1, wherein the chucking surface is roughed so as to have at least one indentation that is no more than 20 $\mu$m deep relative to the chucking surface.

10. The electrostatic chucking device of claim 1, further comprising an electrically insulative substrate arranged such that the electrodes are situated between the substrate and the dielectric layer.

11. An electrostatic chucking device to which a sample can be secured by an electrostatic chucking force, comprising:
an electrically insulative substrate;
first and second electrostatic electrodes situated on an upstream-facing surface of the insulative substrate; and
a dielectric layer defining a sample-contacting surface, the dielectric layer being situated on the electrostatic electrode such that the electrostatic electrodes are sandwiched between the insulative substrate and the dielectric layer, wherein the dielectric layer comprises at least first and second coplanar portions at the chucking surface, the first and second planar portions being associated with the first and second electrodes, respectively, and being formed of respective dielectric materials having different respective dielectric properties.

12. The electrostatic chucking device of claim 11, wherein the first region has a volume resistivity of $10^{14}$ $\Omega$-cm or higher, and the second region has a volume resistivity of $10^{13}$ $\Omega$-cm or less.

13. The electrostatic chucking device of claim 12, wherein:
the chucking surface has a surface area;
the first region occupies at least 20% of the surface area; and
the second region occupies no more than 30% of the surface area.

14. The electrostatic chucking device of claim 11, wherein the first region has a dielectric constant of 20 or higher, and the second region has a dielectric constant of less than 20.

15. The electrostatic chucking device claim 11, wherein each of the first and second electrodes is configured so as to be energized with a voltage that can be independently controllable for each electrode.

16. The electrostatic chucking device of claim 11, further comprising a power source to which the electrodes are electrically connected, the power source being configured to energize the electrodes such that the sample held by the chucking device has a ground electrical potential.

17. The electrostatic chucking device of claim 11, wherein the chucking surface is roughed so as to have at least one indentation that is no more than 20 $\mu$m deep relative to the chucking surface.

18. A method for holding a microlithographic sample, comprising:
(a) providing on an electrostatic chuck a chucking surface comprising a dielectric layer that is divided into at least a first and a second region each formed of a respective dielectric material having a different respective dielectric property;
(b) providing a respective electrode associated with each region; and
(c) independently energizing the electrodes with respective voltages sufficient to hold the sample on the chucking surface.

19. The method of claim 18, wherein step (a) further comprises providing the first region with a volume resistivity of $10^{14}$ $\Omega$-cm or higher, and providing the second region with a volume resistivity of $10^{13}$ $\Omega$-cm or less.

20. The method of claim 19, wherein step (a) further comprises configuring the first region to occupy at least 20% of a surface area of the chucking surface, and configuring the second region to occupy no more than 30% of the surface area.

21. The method of claim 18, wherein step (a) further comprises providing the first region with a dielectric constant of 20 or higher, and providing the second region with a dielectric constant of less than 20.

22. The method of claim 18, wherein step (c) further comprises energizing each electrode with a voltage that is independently controlled for each electrode.

23. The method of claim 18, wherein step (c) further comprises energizing the electrodes such that the sample held by the chucking device has a ground electrical potential.

24. The method of claim 18, wherein step (a) further comprises roughing the chucking surface to have at least one indentation that is no more than 20 $\mu$m deep relative to the chucking surface.

25. An electrostatic chucking device to which a sample can be secured by an electrostatic chucking force, comprising a chucking surface comprising a dielectric layer, the chucking surface having at least a first region and a second region having different respective surface roughness values.

26. The electrostatic chucking device of claim 25, wherein the dielectric layer has a volume resistivity of less than $10^{13}$ $\Omega$-cm.

27. The electrostatic chucking device of claim 25, wherein the surface roughness of the first region is less than 0.2 $\mu$m (Ra) and the surface roughness of the second region is larger than 0.2 $\mu$m (Ra).

28. The electrostatic chucking device of claim 27, wherein the dielectric layer has a volume resistivity of less than $10^{13}$ $\Omega$-cm.

29. The electrostatic chucking device of claim 25, wherein the sample is a wafer.

30. The electrostatic chucking device of claim 26, wherein the sample is a wafer.

31. The electrostatic chucking device of claim 27, wherein the sample is a wafer.

32. A method for holding a microlithographic sample, comprising:
(a) providing on an electrostatic chuck a chucking surface comprising a dielectric layer that is divided into at least a first and a second region each having a respective surface roughness;
(b) providing a respective electrode associated with each region; and
(c) independently energizing the electrodes with respective voltages sufficient to hold the sample on the chucking surface.

33. The method of claim 32, wherein the dielectric layer has a volume resistivity of less than $10^{13}$ Ω-cm.

34. The method of claim 32, wherein the surface roughness of the first region is less than 0.2 μm (Ra) and the surface roughness of the second region is larger than 0.2 μm (Ra).

35. The method of claim 32, wherein the different surface roughnesses of the first and second regions are obtained by polishing both regions to a polish sufficient for the first region, and then grinding the second region to obtain a desired surface roughness of the second region.

36. The electrostatic chucking device of claim 1, wherein:
the first and second regions of the dielectric layer are concentric with each other, with the first region being situated inboard of the second region; and
the first region has a volume resistivity that is lower than the volume resistivity of the second region.

37. The electrostatic chucking device of claim 36, wherein the second region comprises multiple portions separated from each other.

* * * * *